United States Patent
Miranda

[11] Patent Number: 5,868,861
[45] Date of Patent: Feb. 9, 1999

[54] WASHING UNIT FOR JOINT SEAL IN A SEMICONDUCTOR BATH SYSTEM

[76] Inventor: Henry R. Miranda, 3060 Woodside Ter., Fremont, Calif. 94539

[21] Appl. No.: 862,634

[22] Filed: May 23, 1997

[51] Int. Cl.⁶ ....................................................... B05C 3/00
[52] U.S. Cl. ........................ 134/25.4; 134/34; 134/104.1; 134/135; 134/902; 118/429
[58] Field of Search ................................ 134/34, 36, 42, 134/902, 25.1, 25.4, 104.1, 114, 135, 198; 118/429

[56] References Cited

U.S. PATENT DOCUMENTS

| | | | |
|---|---|---|---|
| 4,305,413 | 12/1981 | Dougherty | 134/90 |
| 4,668,303 | 5/1987 | Weber | 134/22.13 |
| 5,054,519 | 10/1991 | Berman | 137/563 |
| 5,205,306 | 4/1993 | Peterson | 134/104.2 |
| 5,393,347 | 2/1995 | Miranda | 118/429 |
| 5,638,843 | 6/1997 | Strickland | 134/45 |

*Primary Examiner*—Jeffrey Snay
*Attorney, Agent, or Firm*—Townsend & Townsend and Crew LLP

[57] ABSTRACT

The present invention provides for a semiconductor bath system which has a tank, a housing which joins the tank, and a seal for the joint between the housing and the tank. A porous conduit is placed in close proximity with the seal. A pump drives washing fluid through the conduit and through the walls of the conduit so that the fluid irrigates the seal to preserve its integrity.

17 Claims, 3 Drawing Sheets

5,868,861

WASHING UNIT FOR JOINT SEAL IN A SEMICONDUCTOR BATH SYSTEM

BACKGROUND OF THE INVENTION

The present invention is related to the field of semiconductor processing and, more particularly, to the design of semiconductor bath systems used in cleaning and rinsing semiconductor wafers.

Semiconductor bath systems clean and rinse semiconductor wafers. Often corrosive fluids, such as various acids, are used in the bath system. To protect the bath system's tank, which holds the fluids, and the different elements which are mounted to the tank, a housing encloses the sides of the tank.

However, despite the fact that the joint between the tank and housing is usually sealed, a recurring problem is that the seal between the tank and housing is often broken. The constant dripping of corrosive fluids and the condensation of such corrosive fumes generated by the semiconductor processes eventually cause the seal to lose its integrity. With the breach of the seal, it is a short time before the elements and connections to the tank are adversely affected by leaking fluids and the bath system is rendered inoperative. The failure typically requires removal of the bath system from a so-called "wet bench" in the semiconductor fabrication facility and a disassembly of the bath system to effect a repair. The failure is inconvenient, expensive and may affect production efficiencies of the facility.

One solution to this problem has been to keep the seal at the tank-housing joint in a pool of water so that corrosive fluids are washed away. However, this solution is cumbersome because a trough of water must be inconveniently maintained high against the outside walls of the tank and housing where they are joined and sealed. On the other hand, the present invention provides for the washing of the joint and seal in an arrangement which is compatible and convenient with present semiconductor processing systems.

SUMMARY OF THE INVENTION

To accomplish these ends, the present invention provides for a semiconductor bath system which has a tank, a housing for the tank so that a joint is formed between the tank and housing, and a seal for the joint. A porous conduit is placed in close proximity to the seal and a pump is connected to the conduit and a reservoir of washing fluid. The pump drives the fluid through the conduit and through the walls of the conduit so that the fluid washes over the seal.

DETAILED DESCRIPTION OF PREFERRED EMBODIMENTS

Figure 1:
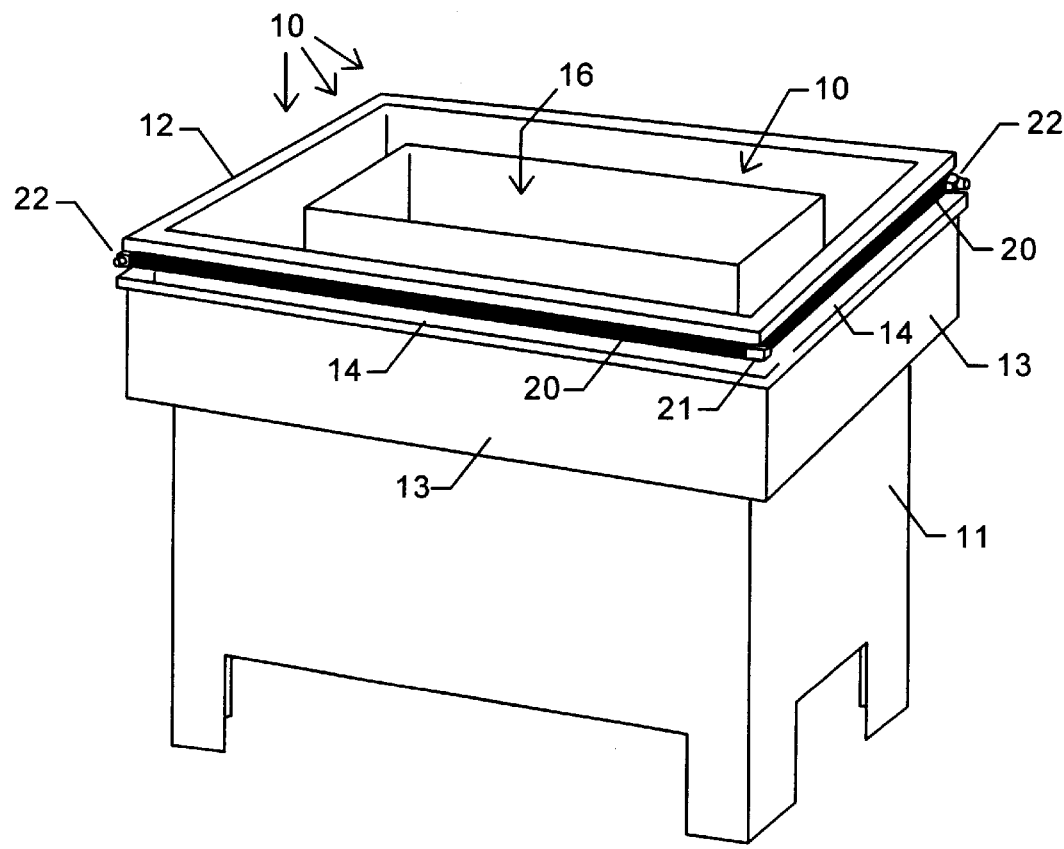
FIG. 1 is a perspective view of a semiconductor bath system with a washing unit according to an embodiment of the present invention.

FIG. 1 illustrates a representative semiconductor bath system according to the present invention. The system has a tank 10 which holds the various fluids used for cleaning and rinsing the semiconductor wafers. Quartz glass is a common material for the tank 10. While the particular structure of a tank of a semiconductor bath system is not particularly germane to the present invention, the exemplary tank 10 of FIG. 1 has a central portion 16 which holds semiconductor wafers for washing and rinsing operations and an outer portion 17 which catches the circulating overflow of fluid from the central portion 16. A more complete description of this type of tank structure is found in U.S. Pat. No. 4,955, 402, entitled "Constant Bath System with Weir" and assigned to the present assignee.

Besides fluid couplings, the tank 10 is also connected to other components, such as heating elements (not shown) to maintain the bath in desired temperature ranges, and even sonic elements (not shown) to provide acoustical energy against the wafers to aid the cleaning operations. These elements are typically mounted on the outside of the sidewalls, or the bottom, of the tank 10.

A housing 11 fits around the sidewalls and bottom of the tank 10. The top of the tank 10 remains open so that semiconductor wafers may be placed into and removed from the tank. The top edge of the tank 10 is formed into a lip 12 which rests on top of the housing 11 to form a joint 15 between the tank 10 and housing 11. The joint 15 runs around the tank 10 under the lip 12.

Figure 2:
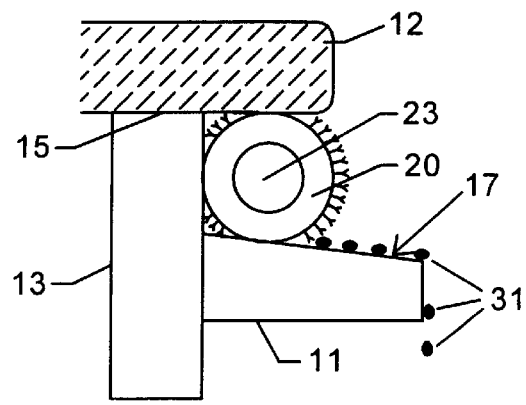
FIG. 2 is a detailed cross-sectional view of a portion of the semiconductor bath system of FIG. 1.

The joint 15 is detailed in FIG. 2, a detailed cross-section along line 2-2' in FIG. 1 of a portion of the semiconductor bath system near the top edge of the tank 10 and housing 11. In this region the housing 11 is formed by a vertical sidewall 13 upon which the tank lip 12 rests to form the joint 15. Epoxy (not shown) is used in the joint 15 to hold the tank 10 and housing 11 together, and to form a seal for the joint 15. The seal prevents fluids from seeping into the space between the tank 10 and housing 11. As mentioned previously, the tank 10 has many elements, besides fluid connections, mounted on the outside of the tank sidewalls and bottom. Leaks through the joint 15 can adversely affect these elements.

To keep the joint 15 and its seal irrigated in a washing fluid, the semiconductor bath system according to the present invention has a washing unit formed by a porous conduit 20, which are divided into four legs to match the four sides of the tank 10 and housing 11. Each conduit leg runs under the lip 12 of the tank 10 and on a flange 14, which is part of the housing 11. The flange 14 extends outwardly from the housing sidewall 13 and has an upper surface 17 which slopes away from the sidewall 13. The conduit 20 rests on the upper surface 17 of the housing flange 14. As illustrated, the conduit 20 is in the shape of a hollow cylinder with a central hollow 23 for the fluid to move along the conduit 20. The conduit 20 is preferably formed from a porous material, such as porous plastic, so that if pumped with pressure, the fluid leaks through the walls of the conduit 20 to irrigate the joint 15 and to flow away along the surface 17, as illustrated by droplets 31.

Materials having pores of with diameters in the range of 20 to 350 $\mu$m have been found to provide a flow of washing fluid to sufficient irrigation of the joint 15 under a fluid pressure of 5 to 75 lbs/square inch. A suitable material for the conduit 20 is Porex (a trademarked material of Porex Technologies, Inc. of Fairborn, Ga.) piping material. Porex piping material having an outer diameter of ½ inches and an inner diameter of ¼ inches have proved to be a satisfactory conduit.

Figure 3A:
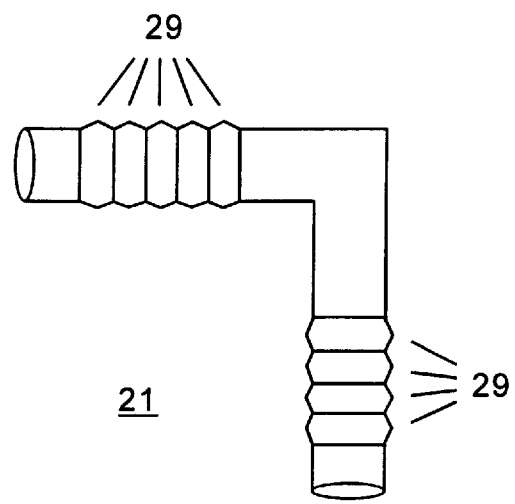
FIG. 3A is a detailed perspective view of the elbow joint connecting some of the conduit legs of the washing unit of FIG. 1.
Figure 3B:
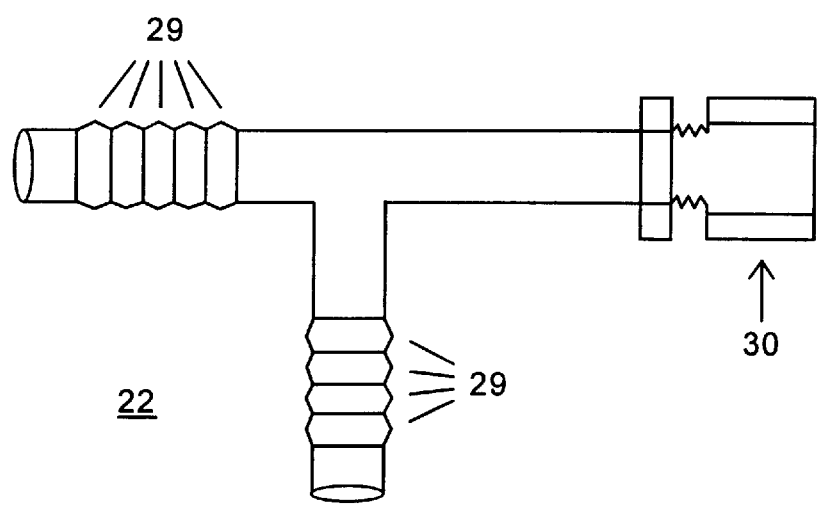
FIG. 3B is a detailed perspective view of the Y-shaped joint connecting some of the conduit legs of the washing unit of FIG. 1.

The legs of the conduit 20 are joined together at the corners of the bath system by elbow joints 21 and Y-joint 22. The elbow joints 21 are located at one set of opposing corners of the bath system; the Y-joints 22 are located at the other sets of opposing corners. FIGS. 3A and 3B are detailed drawings of the elbow joints 21 and Y-joints 22 (actually T-shaped) respectively. These materials are formed from plastic and have ridged barbs 29 at their ends to hold the conduit legs in place once the joint ends are inserted into the hollow 23 at the end of a conduit 20. The Y-joints 22 also have a compression fitting 30 at a third end which receives tubing 27, discussed immediately below. Suitable elbow joints and Y-joints of polypropylene may be purchased from Value Plastics, of Ft. Collins, Colo.

Figure 4:
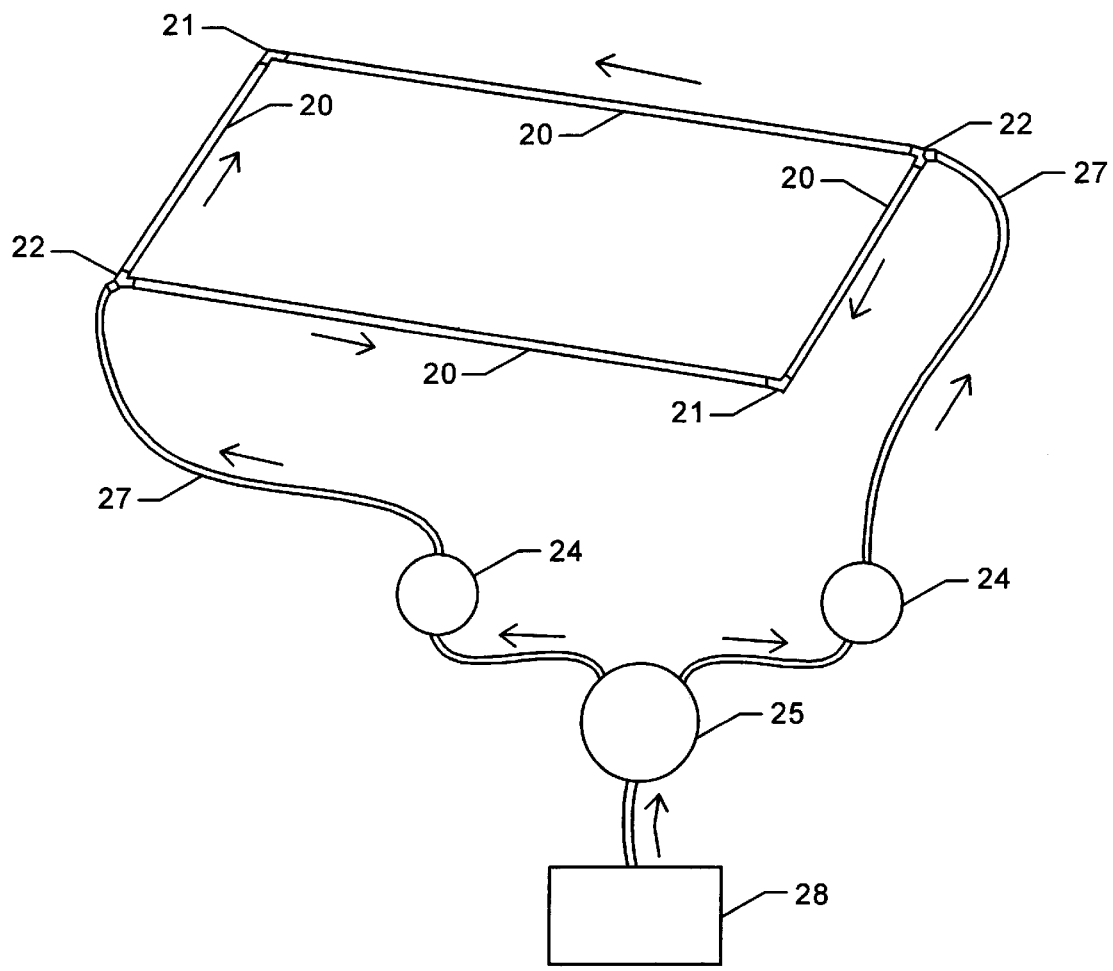
FIG. 4 is a representational isolated view of the washing unit of FIG. 1.

FIG. 4 illustrates a simplified top view of the washing unit of the present invention. The legs of the conduit 20, elbow joints 21 and Y-joints 22 fit around the tank and housing of the bath system in close proximity with the tank/housing joint and its seal. A source of pressurized washing fluid is connected to each of the Y-joints 22 by flexible tubing 27. For example, as shown in FIG. 4, a pump 25 drives fluid into the flexible tubing 27 from a source 28 of washing fluid for the semiconductor bath system. A typical washing fluid is de-ionized (DI) water. Each branch of the flexible tubing 27 is connected to a flow meter 24 to ensure that water is adequately delivered to each Y-joint. A flow of one liter per minute through each flow meter 24 has been found effective for a bath system having a length of 24 inches and a width of 15 inches. Arrows show the direction of the flow of washing fluid from the fluid source 28 to the conduits 20.

Alternatively, the pressurized washing fluid source can be the DI water system of a semiconductor facility, or simply, the outside public water system of a municipality or similar organization. Of course, these different sources of pressurized washing fluids present various issues of semiconductor facility cleanliness which must be addressed.

The pumped washing fluid is pushed through the conduit 20 and keeps the joint 15 in contact with moving water. The pump 25 provides sufficient pressure to irrigate the joint appropriately. The water eventually flows down the sloped upper surface 17 and off the flange 14 without touching the rest of the housing 11. The washing fluid is then pumped away by the pumps of the wet bench into which the bath system has been installed.

While an arrangement of three elbow joints 21 and one Y-joint could be used to introduce the washing fluid into the conduits 20, it has been found that the arrangement of FIG. 4 is more effective. The delivery of washing fluid along the lengths of each of the conduit legs 20 appears to be more evenly distributed.

Besides the relative simplicity and low cost of the washing unit of the present invention, installation is straightforward and easy to do. Retrofitting semiconductor bath systems with the washing unit of the present invention is also straightforward and relatively inexpensive. The length and width of a bath system are measured for the conduit legs, which are then cut from a length of porous plastic cylinder. The elbow and Y-joints are then fitted into the legs of the conduit 20 and the Y-joints are also connected to the pump and source of washing fluid. The washing unit is ready for operation without an elaborate re-fitting procedure. There is no need to remove the bath system from its installation on its wet bench.

While the above is a complete description of the preferred embodiments of the present invention, various alternatives, modifications and equivalents may be used. It should be evident that the present invention is equally applicable by making appropriate modifications to the embodiment described above. Therefore, the above description should not be taken as limiting the scope of invention which is defined by the metes and bounds of the appended claims.

What is claimed is:

1. A semiconductor bath system comprising
    a tank;
    a housing for said tank, said housing engaging said tank to form a joint therebetween;
    a seal for said joint;
    a conduit in close proximity to said seal, said conduit having porous walls; and
    a source of pressurized washing fluid connected to said conduit, said fluid passing through said conduit and said conduit walls so that said fluid irrigates said seal.

2. The semiconductor bath system of claim 1 wherein said source of pressurized washing fluid comprises
    a pump; and
    a reservoir of said washing fluid, said reservoir connected to said pump and said pump connected to said conduit.

3. The semiconductor bath system of claim 1 wherein said conduit comprises a plurality of hollow cylinders, each cylinder having porous walls.

4. The semiconductor bath system of claim 1 wherein said conduit comprises walls having pores with diameters in the range from 20 to 350 $\mu$m.

5. The semiconductor bath system of claim 1 wherein said conduit abuts said seal.

6. The semiconductor bath system of claim 1 wherein said washing fluid reservoir holds water.

7. The semiconductor bath system of claim 6 wherein said washing fluid reservoir holds de-ionized water.

8. The semiconductor bath system of claim 1 wherein said tank has a plurality of sidewalls, a bottom and an open top, said open top defining an upper edge for said tank, said housing engaging said tank proximate said upper edge and around said tank, said conduit extending around said tank.

9. The semiconductor bath system of claim 8 wherein said conduit comprises legs extending along said tank sidewalls and joints fluidly connecting said conduit legs.

10. The semiconductor bath system of claim 9 wherein said tank comprises a horizontal lip around said upper edge of said tank, said housing comprises vertical sidewalls corresponding to said tank sidewalls, said lip of said tank resting upon said vertical housing sidewalls forming said joint therebetween, said conduit legs along said joint under said lip.

11. The semiconductor bath system of claim 10 wherein said housing comprises a flange extending horizontally below said conduit legs from said vertical housing sidewalls so that said fluid from said conduit flows along an upper surface of said flange and away from said housing sidewalls.

12. A method for washing a sealed joint in a semiconductor bath system, said method comprising
    disposing an enclosed conduit in close proximity with said sealed joint, said conduit having porous walls; and
    pumping a washing fluid through said porous conduit so that said fluid passes through said porous walls of said conduit and irrigates said sealed joint.

13. The method of claim 12 wherein said pumping step further comprises pumping de-ionized water through said porous conduit for irrigating said joint.

14. The method of claim 12 wherein said disposing step comprises abutting said joint with said conduit.

15. The method of claim 12 wherein said pumping step comprises pumping said washing fluid through pores in said conduit walls, said pores having diameters in the range from 20 to 350 $\mu$m.

16. The method of claim 12 wherein said pumping step comprises pumping said washing fluid from a reservoir of washing fluid thorough said conduit at a flow rate in the range of 1 to 4 liters per minute.

17. The method of claim 16 wherein said pumping step comprises pumping said washing fluid through two channels from said washing fluid reservoir so that distribution of fluid pumped through said porous walls is substantially along said conduit.

* * * * *